United States Patent
Rice et al.

(10) Patent No.: US 10,359,743 B2
(45) Date of Patent: *Jul. 23, 2019

(54) SUBSTRATE PROCESSING SYSTEMS, APPARATUS, AND METHODS WITH SUBSTRATE CARRIER AND PURGE CHAMBER ENVIRONMENTAL CONTROLS

(71) Applicant: Applied Materials, Inc., Santa Clara, CA (US)

(72) Inventors: Michael R. Rice, Pleasanton, CA (US); Dean C. Hruzek, Cedar Park, TX (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 492 days.

This patent is subject to a terminal disclaimer.

(21) Appl. No.: 14/931,520

(22) Filed: Nov. 3, 2015

(65) Prior Publication Data

US 2016/0147235 A1     May 26, 2016

Related U.S. Application Data

(60) Provisional application No. 62/108,834, filed on Jan. 28, 2015, provisional application No. 62/084,350, filed on Nov. 25, 2014.

(51) Int. Cl.
  *G02B 15/02* (2006.01)
  *H01L 21/00* (2006.01)
  (Continued)

(52) U.S. Cl.
  CPC ........ *G05B 15/02* (2013.01); *H01L 21/67775* (2013.01)

(58) Field of Classification Search
  CPC ......... Y02P 90/02; G06Q 10/06; G06F 9/465; G05B 19/418
  See application file for complete search history.

(56) References Cited

U.S. PATENT DOCUMENTS 3,688,540 A    9/1972 Russel
4,781,511 A    11/1988 Harada et al.
(Continued)

FOREIGN PATENT DOCUMENTS

| CN | 101656199 A | 2/2010 |
| CN | 202888140 U | 4/2013 |

(Continued)

OTHER PUBLICATIONS

Non-Final Office Action of U.S. Appl. No. 14/456,631 dated Mar. 23, 2017.
(Continued)

*Primary Examiner* — Ronald D Hartman, Jr.
(74) *Attorney, Agent, or Firm* — Lowenstein Sandler LLP

(57) ABSTRACT

Electronic device processing systems including environmental control of the factory interface, a carrier purge chamber, and one or more substrate carriers are described. One electronic device processing system has a factory interface having a factory interface chamber, one or more substrate carriers coupled to the factory interface, and an environmental control system coupled to the factory interface, the carrier purge chamber, and the one or more substrate carriers and operational to control an environment at least within the factory interface chamber, carrier purge chamber, and the one or more substrate carriers. Methods for processing substrates are described, as are numerous other aspects.

23 Claims, 6 Drawing Sheets

(51) Int. Cl.
*G05B 15/02* (2006.01)
*H01L 21/677* (2006.01)

(56) References Cited

U.S. PATENT DOCUMENTS

| | | | |
|---|---|---|---|
| 5,853,486 | A | 12/1998 | Ono et al. |
| 6,454,508 | B2 | 9/2002 | Toshima et al. |
| 6,454,519 | B1 | 9/2002 | Toshima et al. |
| 6,599,076 | B2 | 7/2003 | Toshima et al. |
| 6,877,219 | B1 | 4/2005 | Theriault |
| 6,955,197 | B2 | 10/2005 | Elliott et al. |
| 7,059,849 | B2 | 6/2006 | Sakata |
| 7,147,424 | B2 | 12/2006 | Weaver |
| 7,258,520 | B2 | 8/2007 | Weaver |
| 7,299,831 | B2 | 11/2007 | Elliot |
| 7,467,919 | B2 | 12/2008 | Weaver |
| 7,611,319 | B2 | 11/2009 | Shah et al. |
| 8,074,597 | B2 | 12/2011 | Shah et al. |
| 8,443,484 | B2 | 5/2013 | Ozaki et al. |
| 8,601,975 | B2 | 12/2013 | Shah et al. |
| 8,689,812 | B2 | 4/2014 | Shah et al. |
| 8,777,553 | B2 | 7/2014 | Hirano |
| 8,796,589 | B2 | 8/2014 | Quiles et al. |
| 8,827,695 | B2 | 9/2014 | Hsiao |
| 9,010,384 | B2 | 4/2015 | Yoshimura |
| 9,091,491 | B2 | 7/2015 | Lee |
| 9,695,509 | B2 | 7/2017 | Hirano |
| 2002/0023458 | A1 | 2/2002 | Sakata |
| 2003/0002960 | A1 | 1/2003 | Toshima et al. |
| 2003/0031537 | A1 | 2/2003 | Tokunaga |
| 2003/0031538 | A1 | 2/2003 | Weaver |
| 2004/0081546 | A1 | 4/2004 | Elliott et al. |
| 2006/0225299 | A1 | 10/2006 | Kim et al. |
| 2006/0245854 | A1 | 11/2006 | Toshima et al. |
| 2007/0095284 | A1* | 5/2007 | Iizuka ............... C23C 16/45565 118/715 |
| 2007/0116545 | A1 | 5/2007 | Rice et al. |
| 2007/0140822 | A1 | 6/2007 | Elliott et al. |
| 2007/0295274 | A1 | 12/2007 | Webb et al. |
| 2009/0108544 | A1 | 4/2009 | Sico et al. |
| 2009/0110518 | A1* | 4/2009 | Rice ............... H01L 21/67386 414/220 |
| 2009/0129897 | A1 | 5/2009 | Babbs et al. |
| 2009/0169342 | A1 | 7/2009 | Yoshimura et al. |
| 2009/0211742 | A1 | 8/2009 | Lee |
| 2009/0317214 | A1* | 12/2009 | Hsiao ............... H01L 21/67017 414/217 |
| 2010/0143081 | A1 | 6/2010 | Oh et al. |
| 2010/0178147 | A1 | 7/2010 | Kremerman et al. |
| 2012/0083918 | A1* | 4/2012 | Yamazaki ......... H01L 21/67389 700/112 |
| 2012/0237323 | A1 | 9/2012 | Sugawara |
| 2012/0241032 | A1 | 9/2012 | Sugawara |
| 2012/0289058 | A1 | 11/2012 | Hirano |
| 2013/0000757 | A1 | 1/2013 | Yoshimura |
| 2015/0013771 | A1 | 1/2015 | Quiles et al. |
| 2015/0016941 | A1 | 1/2015 | Rice et al. |
| 2015/0022821 | A1 | 1/2015 | Mazzocco et al. |
| 2015/0045961 | A1* | 2/2015 | Koshti ............. H01L 21/67248 700/276 |
| 2016/0035608 | A1 | 2/2016 | Babbs |

FOREIGN PATENT DOCUMENTS

| | | |
|---|---|---|
| JP | 2000-150613 | 5/2000 |
| JP | 2003-045933 | 2/2003 |
| JP | 2004-311940 A | 11/2004 |
| JP | WO 2005/124853 | 4/2008 |
| JP | 2009-088437 | 4/2009 |
| JP | 2009-541599 | 11/2009 |
| JP | 2011-512642 | 4/2011 |
| JP | 2013-120760 | 6/2013 |
| TW | 200811926 | 3/2008 |
| WO | WO 2012/133441 | 10/2012 |

OTHER PUBLICATIONS

International Preliminary Report on Patentability and Written Opinion of International Application No. PCT/US2014/050561 dated Feb. 25, 2016.
Chinese Search Report of Chinese Application No. 201480043188.6 dated Mar. 27, 2017.
International Preliminary Report on Patentability of International Application No. PCT/US2015/058761 dated Jun. 8, 2017.
Oct. 10, 2017 Reply to Aug. 22, 2017 Final Office Action of U.S. Appl. No. 14/456,631.
Advisory Action of U.S. Appl. No. 14/456,631 dated Oct. 18, 2017.
Final Office Action of U.S. Appl. No. 14/456,631 dated Aug. 22, 2017.
Taiwan Search Report of Taiwan Application No. 103127667 dated Nov. 8, 2017.
Non-Final Office Action of U.S. Appl. No. 14/456,631 dated Dec. 8, 2017.
International Search Report and Written Opinion of International Application No. PCT/US2015/058761 dated Feb. 15, 2016.
International Search Report and Written Opinion of International Application No. PCT/US2014/050561 dated Nov. 25, 2014.
Jul. 24, 2017 Reply to Mar. 23, 2017 Non-Final Office Acton of U.S. Appl. No. 14/456,631.
Apr. 9, 2018 Reply to Dec. 8, 2017 Non-Final Office Action of U.S. Appl. No. 14/456,631.
Chinese Search Report of Chinese Application No. 201480043188.6 dated May 21, 2018.
Final Office Action of U.S. Appl. No. 14/456,631 dated Aug. 9, 2018.
Oct. 8, 2018 Reply to Aug. 9, 2018 Final Office Action of U.S. Appl. No. 14/456,631.
Applicant-Initiated Interview Summary of U.S. Appl. No. 14/456,631 dated Oct. 9, 2018.
Notice of Allowance of U.S. Appl. No. 14/456,631 dated Nov. 7, 2018.

* cited by examiner

SUBSTRATE PROCESSING SYSTEMS, APPARATUS, AND METHODS WITH SUBSTRATE CARRIER AND PURGE CHAMBER ENVIRONMENTAL CONTROLS

RELATED APPLICATIONS

The present application claims priority to, and the benefit of, U.S. Provisional Application 62/108,834 filed on Jan. 28, 2015, and entitled "SUBSTRATE PROCESSING SYSTEMS, APPARATUS, AND METHODS WITH SUBSTRATE CARRIER AND PURGE CHAMBER ENVIRONMENTAL CONTROLS", and U.S. Provisional Application 62/084,350 filed on Nov. 25, 2014, and entitled "SUBSTRATE PROCESSING SYSTEMS, APPARATUS, AND METHODS WITH SUBSTRATE CARRIER AND PURGE CHAMBER ENVIRONMENTAL", the disclosures of which are each hereby incorporated by reference for all purposes herein.

FIELD

Embodiments relate to electronic device manufacturing, and more specifically to substrate carriers and equipment front end modules (EFEMs) interfaces, and apparatus, systems, and methods for processing of substrates.

BACKGROUND

Processing of substrates in semiconductor component manufacturing is generally carried out in multiple process tools, where the substrates travel between the process tools in substrate carriers (e.g., Front Opening Unified Pods or FOUPs). The FOUPs may be docked to an EFEM (otherwise referred to as a "factory interface") that includes a load/unload robot that is operable to transfer substrates between the respective FOUPs and one or more load locks of the mainframe of the process tool, therefore allowing pass through of substrates to a transfer chamber of the process tool for processing. Existing substrate processing systems may benefit from efficiency and/or process quality improvements.

Accordingly, systems, apparatus, and methods having improved efficiency and/or capability in the processing of substrates are desired.

SUMMARY

In one aspect, an electronic device processing system is provided. The electronic device processing system includes a factory interface including a factory interface chamber, one or more substrate carriers coupled to the factory interface, and an environmental control system coupled to the factory interface and to the one or more substrate carriers and operable to control an environment within the one or more substrate carriers and a factory interface chamber of the factory interface.

In another aspect, an electronic device processing system is provided. The electronic device processing system includes a factory interface including a factory interface chamber, one or more substrate carriers coupled to the factory interface, a carrier purge chamber between the factory interface chamber and the one or more substrate carriers, and an environmental control system coupled to the carrier purge chamber and the one or more substrate carriers and operable to control an environment within the one or more substrate carriers and the carrier purge chamber.

In a method aspect, a method of processing substrates within an electronic device processing system is provided. The method includes providing a factory interface including a factory interface chamber, providing one or more substrate carriers docked to the factory interface, providing a carrier purge chamber between the factory interface chamber and the one or more substrate carriers, and controlling environmental conditions within the carrier purge chamber and the one or more substrate carriers.

In yet another method aspect, a method of processing substrates within an electronic device processing system is provided. The method includes providing a factory interface including a factory interface chamber, one or more substrate carriers docked to the factory interface, and one or more carrier purge chambers within the factory interface chamber, and controlling environmental conditions within the factory interface chamber, the one or more carrier purge chambers, and the one or more substrate carriers.

In another aspect, an electronic device processing system is provided. The electronic device processing system includes a factory interface including a factory interface chamber, one or more substrate carriers coupled to the factory interface, a carrier purge chamber between the factory interface chamber and the one or more substrate carriers wherein the carrier purge chamber is formed by at least portions of a load port back plate and door opener, and a carrier purge chamber environmental control system configured and adapted to purge the carrier purge chamber until certain environmental conditions are met.

Numerous other aspects are provided in accordance with these and other embodiments of the invention. Other features and aspects of embodiments of the present invention will become more fully apparent from the following detailed description, the appended claims, and the accompanying drawings.

BRIEF DESCRIPTION OF THE DRAWINGS

The drawings, described below, are for illustrative purposes only and are not necessarily drawn to scale. The drawings are not intended to limit the scope of the invention in any way.

DESCRIPTION

Reference will now be made in detail to the example embodiments, which are illustrated in the accompanying drawings. Wherever possible, the same reference numbers will be used throughout the drawings to refer to the same or like parts throughout the several views. Features of the various embodiments described herein may be combined with each other, unless specifically noted otherwise.

Existing electronic device manufacturing systems may suffer from problems when relatively higher humidity, temperature, or other environmental factors (e.g., too high of an oxygen ($O_2$) level, or too high of levels of other chemical contaminants) are observed. In particular, exposure of substrates to relatively high humidity levels, relatively high $O_2$ levels, or other contaminants may adversely affect substrate properties in some embodiments.

According to one or more embodiments of the invention, electronic device processing systems adapted to provide improved substrate processing are provided. The systems and methods described herein may provide efficiency and/or processing improvements in the processing of substrates by controlling environmental conditions to which the substrates are exposed to when in transit between tools and also when interfacing with the factory interface. The factory interface receives substrates from one or more substrate carriers docked to a wall thereof (e.g., docked to a front surface thereof) and a load/unload robot delivers the substrates to one or more load locks coupled on another surface of the factory interface (e.g., a rear surface thereof). In some embodiments, one or more environmental parameters (e.g., a relative humidity, a temperature, an amount of $O_2$, an amount of an inert gas, or an amount of another chemical contaminate) are monitored and controlled, and none of the FOUPs docked to the factory interface may be opened unless certain pre-conditions regarding the environment in a factory interface chamber of the factory interface are met.

Furthermore, the environment within the factory interface is controlled, as well. In short, the environment is controlled, cradle to grave, all along the transport path between load lock of one process tool to a load lock of another process tool.

Further details of example apparatus, system, method embodiments of the invention are described with reference to FIGS. 1-6 herein.

Figure 1:
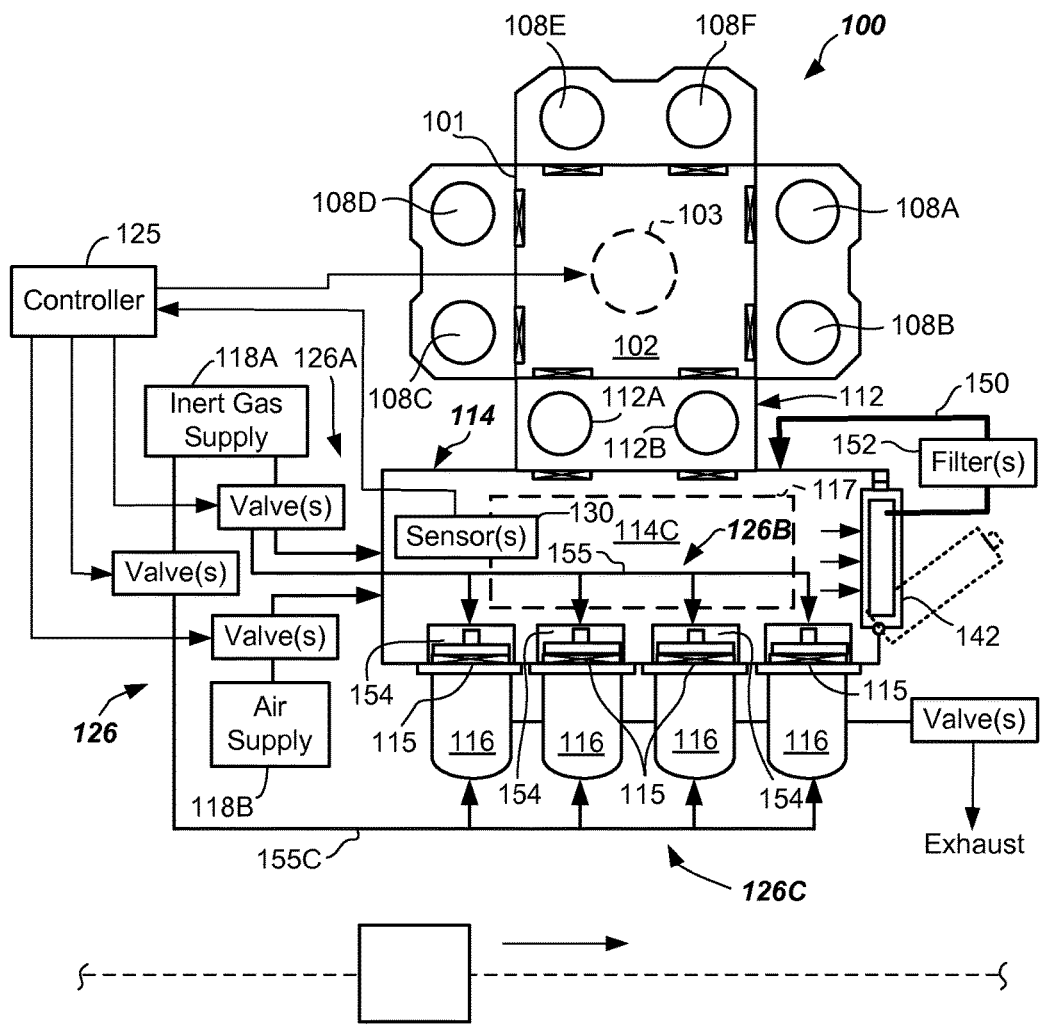
FIG. 1 illustrates a schematic top view of an electronic device processing system including factory interface environmental controls, carrier purge chamber environmental controls, and substrate carrier environmental controls according to one or more embodiments.

FIG. 1 is a schematic diagram illustrating an example embodiment of an electronic device processing system 100 according to one or more embodiments of the present invention. The electronic device processing system 100 may include a mainframe housing 101 having housing walls defining a transfer chamber 102. A transfer robot 103 (shown as a dotted circle) may be at least partially housed within the transfer chamber 102. The transfer robot 103 may be configured and adapted to place or extract substrates to and from destinations via its operation. Substrates as used herein shall mean articles used to make electronic devices or circuit components, such as silica-containing discs or wafers, patterned wafers, glass plates, or the like.

Transfer robot 103, in the depicted embodiment, may be any suitable type of robot adapted to service the various chambers (such as twin chambers shown) coupled to and accessible from the transfer chamber 102, such as the robot disclosed in US Patent Pub. No. 2010/0178147, for example. Other robot types may be used.

The motion of the various arm components of the transfer robot 103 may be controlled by suitable commands to a drive assembly (not shown) containing a plurality of drive motors of the transfer robot 103 as commanded from a controller 125. Signals from the controller 125 may cause motion of the various components of the transfer robot 103.

Suitable feedback mechanisms may be provided for one or more of the components by various sensors, such as position encoders, or the like.

The transfer chamber 102 in the depicted embodiment may be generally square or slightly rectangular in shape. However, other suitable shapes of the mainframe housing 101 and numbers of facets and processing chambers are possible. The destinations for the substrates may be a first process chamber set 108A, 108B, which may be configured and operable to carry out a process on the substrates delivered thereto.

The substrate destinations may also be a second process chamber set 108C, 108D that may be generally opposed from the first process chamber set 108A, 108B. The second process chamber set 108C, 108D may be coupled to the second facet and may be configured and adapted to carry out any suitable process on the substrates. Likewise, the substrate destinations may also be a third process chamber set 108E, 108F that may be generally opposed from a load lock apparatus 112 coupled to the third facet. The third process chamber set 108E, 108F may be configured and adapted to carry out any suitable process on the substrates. The process carried out by process chambers 108A-108F may be any suitable process such as plasma vapor deposition (PVD) or chemical vapor deposition (CVD), etch, annealing, pre-clean, metal ore metal oxide removal, or the like. Other processes may be carried out on substrates therein.

Substrates may be received into the transfer chamber 102 from a factory interface 114, and also exit the transfer chamber 102, to the factory interface 114, through the load lock apparatus 112 that is coupled to a surface (e.g., a rear wall) of the factory interface 114. The load lock apparatus 112 may include one or more load lock chambers (e.g., load lock chambers 112A, 112B, for example). Load lock chambers 112A, 112B included in the load lock apparatus 112 may be single wafer load locks (SWLL) chambers, or multi-wafer load lock chambers.

The factory interface 114 may be any enclosure having sidewall surfaces (including front, rear, two side walls, a top, and a bottom) forming a factory interface chamber 114C. One or more load ports 115 may be provided on surfaces (e.g., front surfaces) of the factory interface 114 and may be configured and adapted to receive one or more substrate carriers 116 (e.g., front opening unified pods or FOUPs) thereat. Factory interface 114 may include a suitable load/unload robot 117 (shown dotted) of conventional construction within the factory interface chamber 114C. Load/unload robot 117 may be configured and operational, once the doors of the substrate carriers 116 are opened, to extract substrates from the one or more substrate carriers 116 and feed the substrates through the factory interface chamber 114C and into the one or more load lock chambers 112A, 112B. Any suitable construction of the load lock apparatus 112 allowing transfer of substrates between the transfer chamber 102 and the factory interface chamber 114C may be used.

The transfer chamber 102 may include slit valves at an ingress/egress to the various process chambers 108A through 108F. Likewise, load lock chambers 112A, 112B in the one or more load lock apparatus 112 may include inner and outer load lock slit valves. Slit valves are adapted to open and close when placing or extracting substrates to and from the various process chambers 108A-108F and load lock chambers 112A, 112B. Slit valves may be of any suitable conventional construction, such as L-motion slit valves.

In the depicted embodiment, an environmental control system 126 is provided. Environmental control system 126 may provide a factory interface environmental control system 126A to the factory interface chamber 114C providing an environmentally-controlled atmosphere thereto. In particular, factory interface environmental control system 126A is coupled to the factory interface 114 and operational to monitor and/or control environmental conditions within the factory interface chamber 114C. In some embodiments, and at certain times, the factory interface chamber 114C may receive an inert gas therein, such as Argon (Ar), Nitrogen ($N_2$), or helium (He), from an inert gas supply 118A. In other embodiments, or at other times, air (e.g., filtered air) may be provided from an air supply 118B.

In more detail, the factory interface environmental control system 126A may control at least one of:
1) relative humidity (RH),
2) temperature (T),
3) an amount of $O_2$, or
4) an amount of inert gas, or
5) an amount of chemical contaminate (e.g., amines, bases, an amount of one or more volatile organic compound (VOC), or the like)
of the environment within the factory interface chamber 114C. Other environmental conditions of the factory interface chamber 114C may be monitored and/or controlled, such as gas flow rate to or from the factory interface chamber or chamber pressure or both.

Environmental control system 126 includes the controller 125. Controller 125 may include suitable processor, memory, and electronic components configured and adapted to receive inputs from various sensors (e.g., relative humidity sensor, oxygen sensor, chemical components sensor, and/or temperature sensor) and control one or more valves. Controller 125 may execute a closed loop or other suitable control scheme. In one embodiment, the control scheme may change a flow rate of a gas being introduced into the factory interface chamber 114C. In another, the control scheme may determine when to transfer substrates into the factory interface chamber 114C based upon conditions of the factory interface chamber 114C.

Environmental control system 126 may in one or more embodiments monitor relative humidity (RH) by sensing RH in the factory interface chamber 114C. Factory interface chamber 114C may include one or more sensors 130 therein. For example, one or more sensors 130 may include a relative humidity sensor in the factory interface chamber 114C. The humidity sensor may be configured and adapted to sense relative humidity (RH) in the factory interface chamber 114C. Any suitable type of relative humidity sensor may be used, such as a capacitive-type sensor. Controller 125 may monitor RH, and when a measured RH value provided to the controller 125 is above a predefined RH threshold value, carrier doors of the one or more substrate carriers 116 coupled to load ports of the factory interface 114 stay closed.

Carrier doors of the substrate carriers 116 may be opened when the measured RH value falls below the predefined RH threshold value. The RH may be lowered by flow of a suitable amount of an inert gas from the inert gas supply 118A into the factory interface chamber 114C. As described herein, the inert gas from the inert gas supply 118A may be argon, nitrogen gas ($N_2$), helium, or mixtures thereof. A supply of dry nitrogen gas ($N_2$) may be quite effective. Compressed bulk inert gases having low $H_2O$ levels (e.g., less than 5 ppm) may be used as the inert gas supply 118A. The supplied inert gas from the inert gas supply 118A may fill the factory interface chamber 114C.

In another aspect, the environmental control system 126 may monitor a RH value with the one or more sensor 130 (e.g., relative humidity sensor), and if the measured relative humidity value is above a pre-defined reference relative humidity value, then an outer load lock slit valve of the one or more load lock apparatus 112 remains closed. The one or more load lock apparatus 112 may remain closed until the RH level falls below the pre-defined reference RH value. As discussed above, the RH may be lowered by a control signal from the controller 125 to the environmental control system 126 initiating a flow of a suitable amount of an inert gas from the inert gas supply 118A into the factory interface chamber 114C.

In one or more embodiments, the pre-defined reference RH value may be less than 1000 ppm moisture, less than 500 ppm moisture, or even less than 100 ppm moisture, depending upon the level of moisture that is tolerable for the particular process being carried out in the electronic device processing system 100.

In order to meet, i.e., fall below, previously-failed environmental preconditions, an inert gas (e.g., dry $N_2$ gas or other inert gas) may be flowed into the factory interface chamber 114C from the inert gas supply 118A. The inert gas supply 118A may be a suitable canister of inert gas under pressure, for example. Flow rates of inert gas provided into the factory interface chamber 114C may be monitored by a suitable flow sensor (not shown) on a delivery line and/or pressure sensor located within the factory interface chamber 114C, or both. Flow rates of 400 SLM or more may be provided by adjusting a valve coupled to the inert gas supply 118A responsive to control signals from controller 125. Pressures of greater than about 500 Pa may be maintained within the factory interface chamber 114C. Flow of inert gas (e.g., $N_2$ or other inert gas) into the factory interface chamber 114C is operative to lower the relative humidity (RH) level, and the carrier door and/or the outer load lock slit valves of the one or more load lock chambers 112A, 112B may be opened when the relative humidity threshold value if met. This helps to ensure that substrates exiting the substrate carriers 116, exiting the load lock chambers 112A, 112B, as well as any substrates passing through the factory interface chamber 114C are exposed to only a suitably low humidity environment.

In another example, environmental preconditions may be met, for example, when a measured oxygen ($O_2$) level in the factory interface chamber 114C falls below a predefined level. Oxygen ($O_2$) level may be sensed by the one or more sensors 130, such as by an oxygen sensor. If the measured oxygen ($O_2$) level falls below a predefined oxygen threshold level (e.g., less than 50 ppm $O_2$, less than 10 ppm $O_2$, less than 5 ppm $O_2$, or even less than 3 ppm $O_2$, or even lower), then substrate exchange may take place through the factory interface chamber 114C. Other suitable oxygen level thresholds may be used, depending on the processing taking place. If the predefined oxygen threshold level in the factory interface chamber 114C is not met, the controller 125 will initiate a control signal to a valve coupled to the inert gas supply 118A and flow inert gas into the factory interface chamber 114C until the predefined oxygen threshold level is met, as determined by the controller 125.

When the predefined oxygen threshold level is met, the carrier door and/or the outer load lock slit valves of the one or more load lock chambers 112A, 112B may be opened. This helps to ensure that substrates exiting the substrate carriers 116, exiting the load lock chambers 112A, 112B, as well as any substrates passing through the factory interface chamber 114C are exposed to relatively low oxygen levels.

In another example, environmental preconditions may be met, for example, when a measured temperature level in the factory interface chamber 114C, such as a temperature of a substrate in the factory interface chamber 114C falls below a predefined temperature threshold level (e.g., less than 100 degrees C., or even lower). In one or more embodiments, the one or more sensors 130 includes a temperature sensor that is configured and adapted to sense a temperature within the factory interface chamber 114C. In some embodiments, the temperature sensor may be placed in close proximity to a path of the substrate as it passes through the factory interface chamber 114C. In some embodiments, the temperature sensor may be a directional temperature sensor, such as a laser sensor that may be used to determine an extent to which the substrate has been cooled. Once the predefined temperature threshold level is met, the suitably cool substrate may be loaded into a substrate carrier 116 for transport.

In another example, environmental preconditions may be met, for example, when a measured chemical contaminant level in the factory interface chamber 114C falls below a predefined threshold level. In one or more embodiments, the one or more sensors 130 may include one or more chemical sensors that are configured and adapted to sense an amount of one or more chemical contaminants (e.g., amines, bases, an amount of one or more volatile organic compound (VOC), or the like) contained within the factory interface chamber 114C. In some embodiments, once a predefined chemical threshold level is met, the substrates 245 may be unloaded from a substrate carrier 116 or otherwise transported through the factory interface chamber 114C.

In some embodiments, the environmental control system 126 of the electronic device processing system 100 may include an air supply 118B coupled to the factory interface chamber 114C. Air supply 118B may be a supply of filtered air provided by a fan or air pump. Air supply 118B may be coupled by suitable conduits and one or more valves to the factory interface chamber 114C. The environmental control system 126 may include an oxygen sensor that is configured and adapted to sense a level of oxygen (O₂) within or exiting the factory interface chamber 114C. In one embodiment, when an operator seeks to enter the factory interface chamber 114C, and initiates an entry request, the controller 125 of the environmental control system 126 may initiate a flow of air from the air supply 118B such that at least some of the inert gas environment is exhausted and replaced with air. When a level of oxygen detected within the factory interface chamber 114C reaches a predetermined oxygen level value that has been determined to be safe, a door interlock (e.g., an electromechanical lock) keeping an access door 142 closed may be unlatched to allow the access door 142 to be opened (as shown dotted) and thus allow the person access to the factory interface chamber 114C.

The environmental control system 126 of the electronic device processing system 100 may also include inert gas recirculation. In particular, the inert gas may be recycled and reused in order to provide more efficient environmental control of the factory interface 114. For example, in the depicted embodiment, the inert gas from the factory interface chamber 114C may be exhausted in an exhaust conduit 150 from the factory interface chamber 114C, filtered through a filter 152, which may be a moisture-reducing filter which may also filter particulates, and then may be provided back into the factory interface chamber. The filter 152 may be a moisture absorbent filter, which may include multiple layers of absorbent materials. However, other mechanisms or devices for reducing moisture content, such as condensers or other moisture removing devices may be used. In some embodiments, the inert gas may also be cooled. In one or more embodiments, the filter 152 may also be capable of filtering one or more chemical contaminates, such as amines, bases, and/or one or more VOCs.

In the depicted embodiment, a portion of the exhaust circulation route may be through the access door 142. For example, the exhaust from the factory interface chamber 114C may enter into a channel (e.g., a duct) formed in the access door 142. Channel may have an entrance from the factory interface chamber 114C at or near a bottom of the access door 142, for example. Exhausted gas may progress to the filter 152, which may be within an upper part of the factory interface chamber 114C in some embodiments, or otherwise part of the factory interface 114. Thus, channel may be part of the exhaust conduit 150.

Inert gas consumption may be monitored in some embodiments, such as by use of a flow sensor (not shown) in the delivery line from the inert gas supply 118A and the measured flow rate may be correlated to attaining a specified RH value within the factory interface chamber 114C. If the amount of inert gas consumption is outside of a pre-established limit, then a leak in the factory interface chamber 114C may be flagged, such as by an message to an operator, a visual indicator, an alarm, or the like. Optionally, if a pressure within the factory interface chamber 114C is outside (e.g., below) a pre-established limit, then a leak in the factory interface chamber 114C may be flagged, as above.

In the depicted embodiment, the environmental control system 126 may include a carrier purge chamber environmental control system 126B. Carrier purge chamber environmental control system 126B provides a flow of inert gas to one or more carrier purge chambers 154.

Carrier purge chamber environmental control system 126B includes the inert gas supply (e.g., inert gas supply 118A) and a plurality of supply conduits 155 and valves coupled thereto. The plurality of supply conduits 155 and valves supply inert gas to the carrier purge chambers 154 at certain times responsive to control signals from the controller 125. For example, the supply of inert gas may be provided to a carrier purge chamber 154 just prior to opening a carrier door of a substrate carrier 116 in order to purge the environment within the carrier purge chamber 154 to meet certain environmental preconditions. Such environmental preconditions may be met before opening the substrate carrier doo allowing the transfer of substrates from the substrate carrier 116 into the factory interface chamber 114C.

Figure 2:
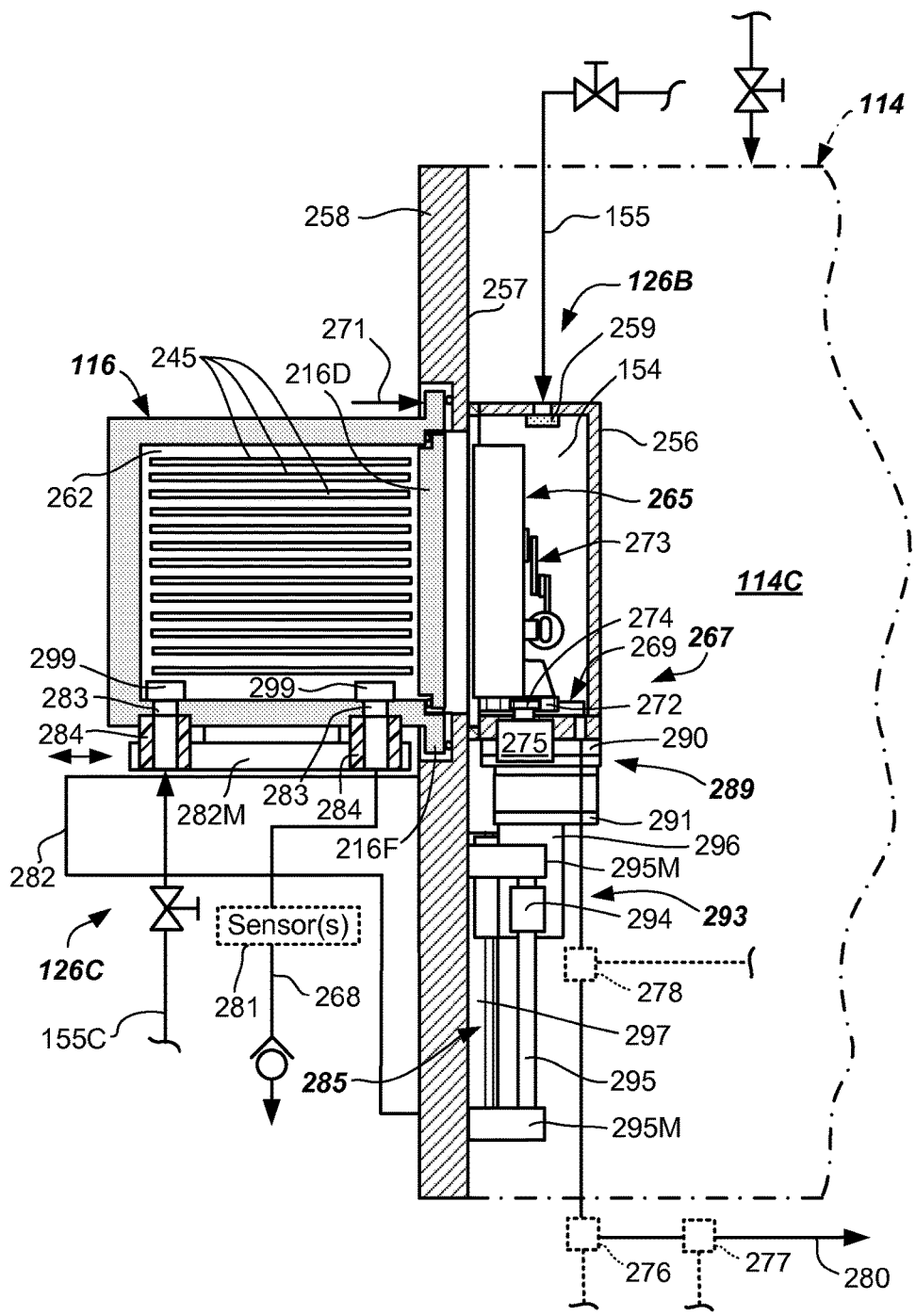
FIG. 2 illustrates a partial rear view of a carrier purge chamber environmental control system according to one or more embodiments.
Figure 3:
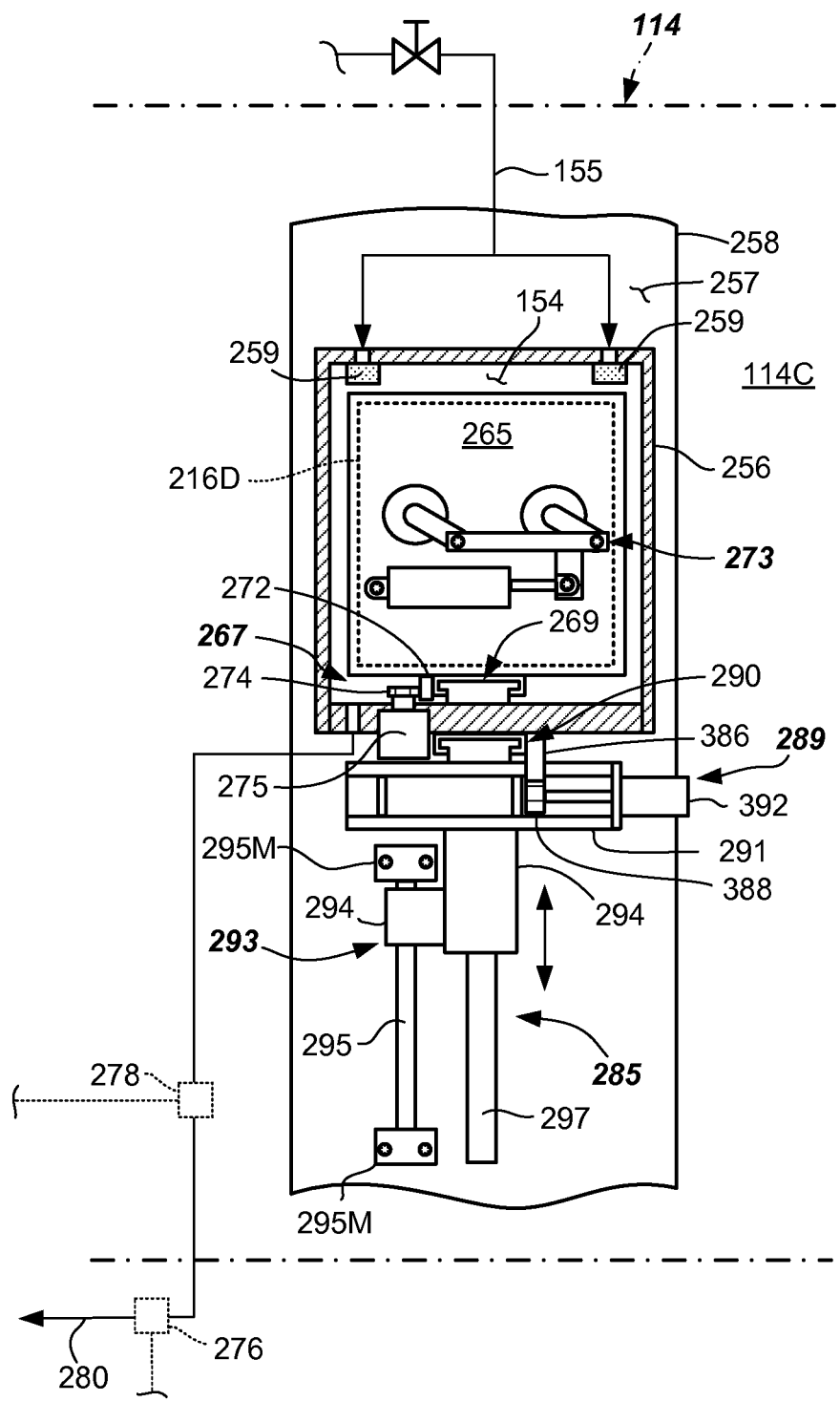
FIG. 3 illustrates a partially cross-sectioned front view of portions of a carrier environmental control system according to one or more embodiments.

The details and the components and operation of the carrier purge chamber environmental control system 126B will now be described with reference to FIGS. 2 and 3. Carrier purge chamber environmental control system 126B may include a carrier purge housing 256 for each substrate carrier 116 that includes chamber purge capability. Such chamber purge capability may be included for some or all of the substrate carriers 116. Carrier purge housing 256 forms a part of each carrier purge chamber 154. Carrier purge housing 256 may seal against a surface of an inside wall 257 of a load port back plate 258 of the factory interface 114 (e.g., a front wall) and form the carrier purge chamber 154. Any suitable seal may be used, such as a gasket or O-ring. Carrier purge housing 256 remains sealed against the surface of an inside wall 257 as the carrier purge chamber 154 receives a purging flow of inert gas from supply conduit 155. Inert gas may be provided at a suitable flow rate (e.g., 1 slm) to purge the carrier purge chamber 154. After a suitable purge to control environmental conditions to a desired predefined level, the carrier door 216D may be opened.

As should be apparent, carrier purge chamber environmental control system 126B is adapted to receive the carrier environment 262 of the substrate carrier 116 into a carrier purge chamber 154 upon opening a carrier door 216D. Carrier door 216D may be opened via operation of a door opener 265 and door retraction mechanism 267. Once the carrier door 216D is opened, further purging of the carrier purge chamber 154 may take place so that the carrier environment 262, which may contain undesirable levels of $O_2$, moisture, particles, or other volatile gases and materials, does not enter the factory interface chamber 114C. Purging of the carrier purge chamber 154 may continue to ensure that certain environmental conditions are met. One or more diffusers 259 may be included at the exits from a supply conduit 155 supplying inert gas into the carrier purge chamber 154.

As will be apparent from the following, a carrier environmental control system 126C may be included in the environmental control system 126, and may be operative to control the carrier environment 262 within the substrate carrier 116 to meet certain environmental conditions. Accordingly, upon opening the carrier door 216D the carrier environment 262 within the substrate carrier 116 may already meet environmental preconditions. Thus, the time to open the door and unload the substrates 245 may be shortened.

The environmental conditions desired for the carrier environment 262 and the carrier purge chamber 154 may be based upon a predefined relative humidity RH threshold level and/or a predefined $O_2$ threshold level and/or a predefined chemical contaminant threshold level for each of the carrier environment 262 and the carrier purge chamber 154, for example. These values may be the same or different. In some embodiments, a relative humidity of less than a predefined RH threshold level (e.g., less than about 5% moisture–less than about 50,000 ppm) may be sought in each of the carrier environment 262 and the carrier purge chamber 154 before opening the carrier door 216D and retracting the carrier purge housing 256 and coupled carrier door 216D away from the inside wall 257. Once separated from the inside wall 257, carrier purge housing 256 may be lowered to allow the load/unload robot 117 (shown as a dotted box in FIG. 1) to access and remove the substrates 245. If the oxygen level is the environmental criteria, then an $O_2$ threshold level of the carrier environment 262 and the carrier purge chamber 154 of less than a predefined threshold level (e.g., less than about 500 ppm $O_2$) may be sought before opening the carrier door 216D and retracting and lowering the carrier purge housing 256. Other predefined threshold levels may be used.

If a chemical contaminant level is the environmental criteria, then a chemical contaminant threshold level of the carrier environment 262 and the carrier purge chamber 154 of less than a predefined threshold level may be sought before opening the carrier door 216D and retracting and lowering the carrier purge housing 256. Chemical contaminants such as amines, bases, an amount of one or more volatile organic compound (VOC), or the like may be undesirable.

In order to attain some or all of these threshold levels in the carrier purge chamber 154, a chamber relative humidity sensor 276 and/or a chamber oxygen sensor 278 and/or one or more chemical sensors 277 may be provided that communicate with the controller 125. Chamber relative humidity sensor 276, one or more chemical sensors 277, and/or a chamber oxygen sensor 278 may be on or in the carrier purge housing 256, in a chamber exhaust conduit 280 within the factory interface chamber 114C, or even located outside of the factory interface 114. Purging of the carrier purge chamber 154 with inert gas (e.g., $N_2$) may continue until the environmental preconditions are met based upon measurements conducted by the sensors. In some embodiments, purging for a certain pre-established time or gas volume, based upon previously-performed experiments, may be used to be used to estimate that the environmental preconditions have been met.

In more detail, the carrier environmental control system 126C, which is a subcomponent of the environmental control system 126, will now be described. Carrier environmental control system 126C is coupled to the one or more substrate carriers 116 and operable to control the carrier environment 262 within the one or more substrate carriers 116 upon being docked to the load port 115. Carrier environmental control system 126C is configured and operable to provide an inert gas from the inert gas supply 118A to the one or more substrate carriers 116. Inert gas may be provided to purge the carrier environment 262 from the substrate carrier 116 prior to opening the carrier door 216D. The inert gas may be $N_2$ gas, argon, or helium, for example.

Carrier environmental control system 126C may be operational to control a relative humidity RH, temperature, an amount of oxygen ($O_2$), an amount of an inert gas within the one or more substrate carriers 116, and/or amounts of one or more chemical contaminants (e.g., amines, bases, an amount of one or more volatile organic compound (VOC), or the like). In some embodiments, a sensor 281, such as an oxygen sensor, RH sensor, chemical contaminant sensor, or combinations of the afore-mentioned, may be provided on a carrier exhaust conduit 268 that is configured and adapted to sense an oxygen level, RH level, chemical contamination levels, or combinations exiting the one or more substrate carriers 116.

Thus, from the foregoing, it should be recognized that the controller 125 may be configured and adapted to control one or more of: a relative humidity, an amount of $O_2$, temperature, an amount of the inert gas, or an amount of one or more chemical contaminants within the carrier purge chamber 154 or the one or more substrate carriers 116, as well as in the factory interface chamber 114C. Overall, the environmental control system 126 provides purge capability to enable environmental control of all relevant volumes between the substrate carrier 116 and the load lock apparatus 112.

The details of the carrier environmental control system 126C will now be further described. As the substrate carrier 116 is mounted onto the docking platform 282, openings 283 in each of the substrate carriers 116 may be aligned with inlet and outlet seals 284, which may be provided on a moving portion 282M of the docking platform 282. Purging may commence as soon as the substrate carrier 116 is docked, and even before the moving portion 282M moves forward to seal the flange 216F of the substrate carrier 116 against the load port back plate 258.

Purging may be accomplished by providing a flow of inert gas from the inert gas supply 118A through the carrier purge conduits 155C. Inert gas may be provided at a suitable flow rate (e.g., 75 slm) to purge the carrier environment 262. After a suitable purge to control environmental conditions to a desired predefined level, the carrier door 216D may be opened. Outflow of the carrier environment 262 may be through carrier exhaust conduit 268, which may include a check valve or the like. Check valve may be set to pop at a predefined pressure, such as about 5 inches of water, for example.

In some embodiments, a face clamping system 271 (denoted by arrow) may be included to engage the flange 216F, such as at two or more locations (e.g., around the periphery).

Face clamping system 271 operates to seal the flange 216F to the load port back plate 258. Ideal locations for clamps of the face clamping system 271 are on the left and right sides of the substrate carrier 116. Any suitable face clamping system may be used.

In operation, the carrier purge housing 256 may surround a door opener 265. The door opener 265 is adapted to be retractable within an interior of the carrier purge housing 256. Retraction of the door opener 265 may be by a door retraction mechanism 267, such as a linear slide 269 and a rack and pinion mechanism. Rack and pinion mechanism may include a rack 272, pinion 274, and drive motor 275 coupled to the pinion 274. Drive signals from the controller 125 to the drive motor 275 causes retraction of the carrier door 216D and mixing of the carrier environment 262 (previously purged) with that in the carrier purge chamber 154 (also previously purged). Any suitable type of door unlock and grasp mechanism 273 may be used on the door opener 265 to grasp and open the carrier door 216D, as is conventional.

Retraction from and closure (e.g., sealing) against the inside wall 257 by the carrier purge housing 256 may be provided by a housing drive system 289. Slide mechanism 290 allows linear motion towards and away from the inside wall 257 relative to a support frame 291 that attaches to an elevator 285. Housing drive system 289 may include a suitable motor and transmission mechanism to cause the motion towards and away from the inside wall 257. In the depicted embodiment, a rack and pinion mechanism is shown (FIG. 3) including housing rack 386 coupled to the carrier purge housing 256, housing pinion 388, and housing drive motor 392. Driving the housing drive motor 392 translates the carrier purge housing 256 horizontally in or out relative to the elevator 285 and the inside wall 257.

Lowering of the carrier purge housing 256 may be accomplished by the elevator 285. Elevator 285 may include any suitable mechanism construction for providing vertical motion of the carrier purge housing 256. For example, as depicted, the elevator 285 includes a linear bearing assembly 293 including a bearing slide 294, rail 295, and mounting blocks 295M. Mounting blocks 295M may fasten the rail 295 to the inside wall 257. Bearing slide 294 may fasten to a vertical actuator 296. A vertical actuator rail 297 may also be provided, and may be fastened to the inside wall 257. Actuation of the vertical actuator 296 causes vertical motion relative to the vertical actuator rail 297, raising or lowering the support frame 291 and the coupled carrier purge housing 256. Vertical actuator 296 may be any suitable actuator type, such as hydraulic, pneumatic, electrical, or the like. Thus, it should be apparent that operation of the door grasp and unlock mechanism 273 grasps and opens the carrier door 216D after the carrier environmental control system 126C has purged the carrier environment 262, and the carrier purge chamber environmental control system 126B purges the carrier purge chamber 154 to meet environmental preconditions. The rack and pinion mechanism retracts the carrier door 216D, the housing drive system 289 retracts the carrier purge housing 256, and the elevator 285 lowers the carrier purge housing 256 and carrier door 216D so that the load/unload robot 117 may access the substrates 245 in the substrate carriers 116.

Figure 4:
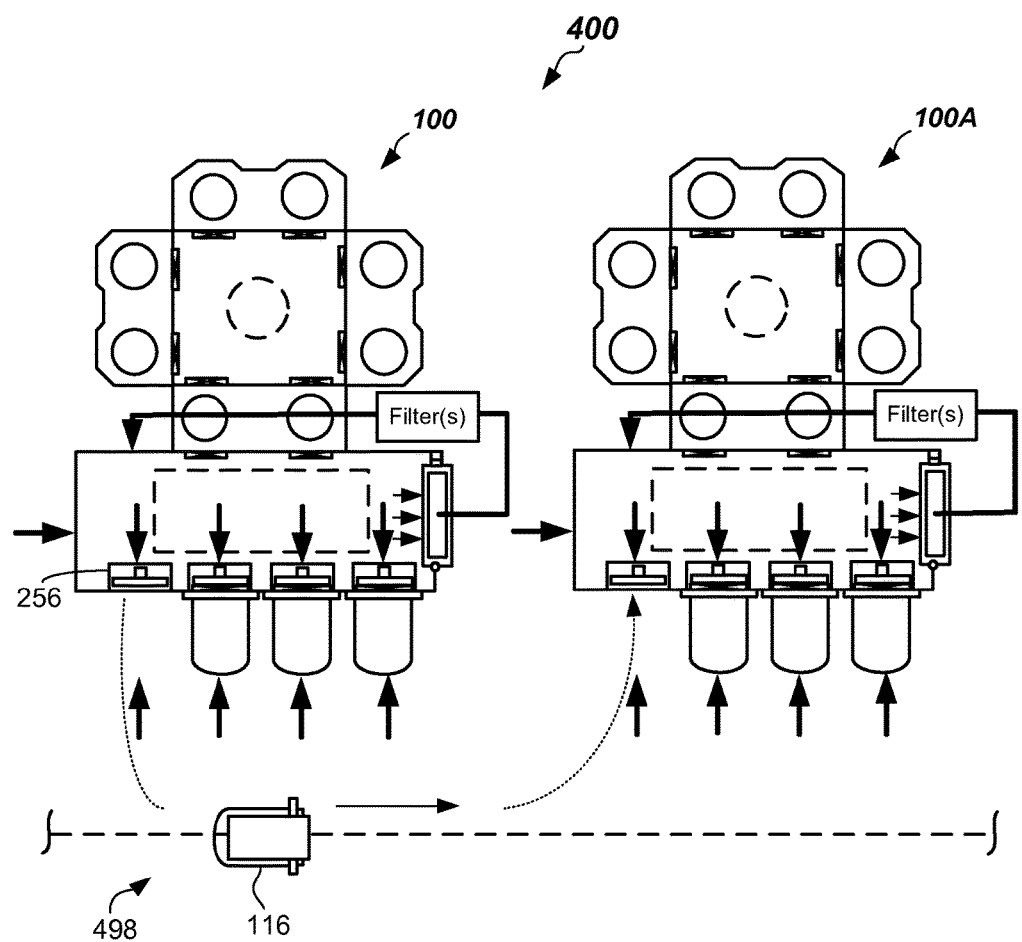
FIG. 4 illustrates a schematic top view of an electronic device processing system including environmental controls according to one or more embodiments.

Now referring now to FIG. 4, a substrate manufacturing system 400 is shown. Substrate manufacturing system 400 includes an electronic device processing system 100 as previously described. A second electronic device processing system 100A is also provided, which may be identical in terms of the factory interface 114 and the environmental control system 126, but may have one or more different substrate processes taking place thereat. As processing is completed at the electronic device processing system 100 and a substrate carrier 116 is filled with substrates 245, the carrier purge housing 256 may be resealed, and the carrier door 216D (FIG. 2) reinstalled on the substrate carrier 116. Substrate carrier 116 may then be loaded onto and carried to the next station for processing (e.g., in a second electronic device processing system 100A) by a transportation system 498. Any suitable transportation system 498 may be used to transport the substrate carriers 116.

During the transport, the substrate carrier 116 may retain the inert gas environment provided therein. Prior to transport, and once the substrate carrier 116 is closed via reinstalling of the carrier door 216D, a post process purge may take place. As shown in FIG. 2, valve assemblies 299 may be provided, which are operative to close the openings 283 and provide a sealed environment when the substrate carrier 116 is detached from the docking platform 282. Any suitable valve assembly 299 that is one-way acting may be used, such as a reed valve, flapper valve, duckbill valve, umbrella valve, ball valve, dome valve, Belleville valve, and the like. The inlet allows only one-way flow in, whereas the exhaust allows one-way flow out. In this manner, the substrates 245 may be provided with environmental controls throughout its processing, i.e., from processing at the electronic device processing system 100 to the processing at the second electronic device processing system 100A.

Figure 5:
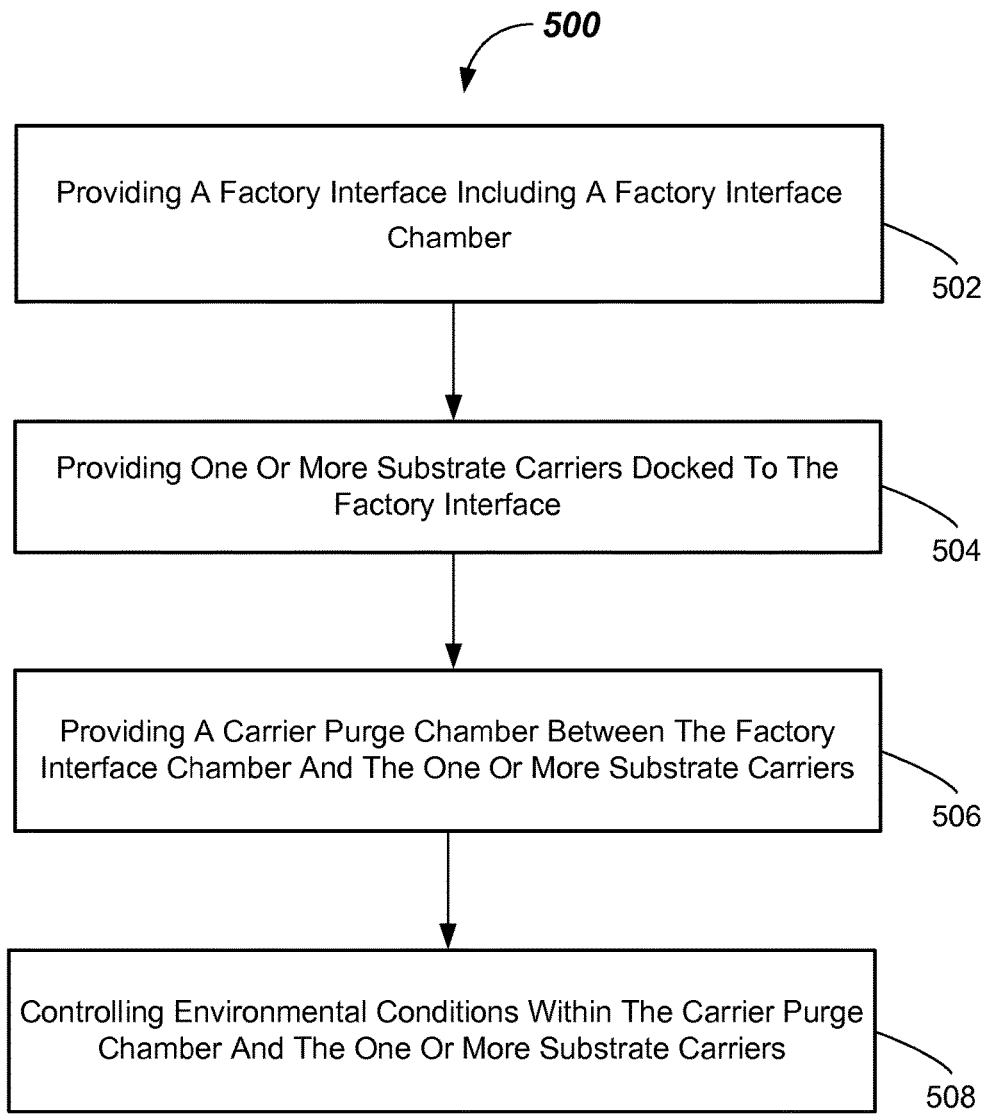
FIG. 5 illustrates a flowchart depicting a method of processing substrates within an electronic device processing system according to one or more embodiments.

Referring now to FIG. 5, one method of processing substrates within an electronic device processing system (e.g., electronic device processing system 100) will be described. The method 500 includes, in 502, providing a factory interface (e.g., factory interface 114) having a factory interface chamber (e.g., factory interface chamber 114C), and, in 504, providing one or more substrate carriers (e.g., substrate carriers 116) docked to the factory interface.

The method 500 includes, in 506, providing a carrier purge chamber (e.g., carrier purge chamber 154) between the factory interface chamber and the one or more substrate carriers; and, in 508, controlling environmental conditions within the carrier purge chamber and the one or more substrate carriers.

The control may include controlling environmental conditions to meet environmental preconditions via an environmental control system 126. For example, controlling environmental conditions to meet environmental preconditions within the substrate carrier and the carrier purge chamber 154 may take place before opening any one of the one or more substrate carrier doors (e.g., carrier doors 216D). The environmental conditions in the factory interface chamber may also be controlled to meet environmental preconditions via a factory interface environmental control system 126A. Controlling environmental conditions within the factory interface chamber 114C may include meeting environmental preconditions in the factory interface chamber 114C before allowing the opening any one of the one or more substrate carrier doors (e.g., carrier doors 216D) or any one of the one or more load lock chambers (e.g., the outer load lock slit valves of the load lock chambers 112A, 112B).

Figure 6:
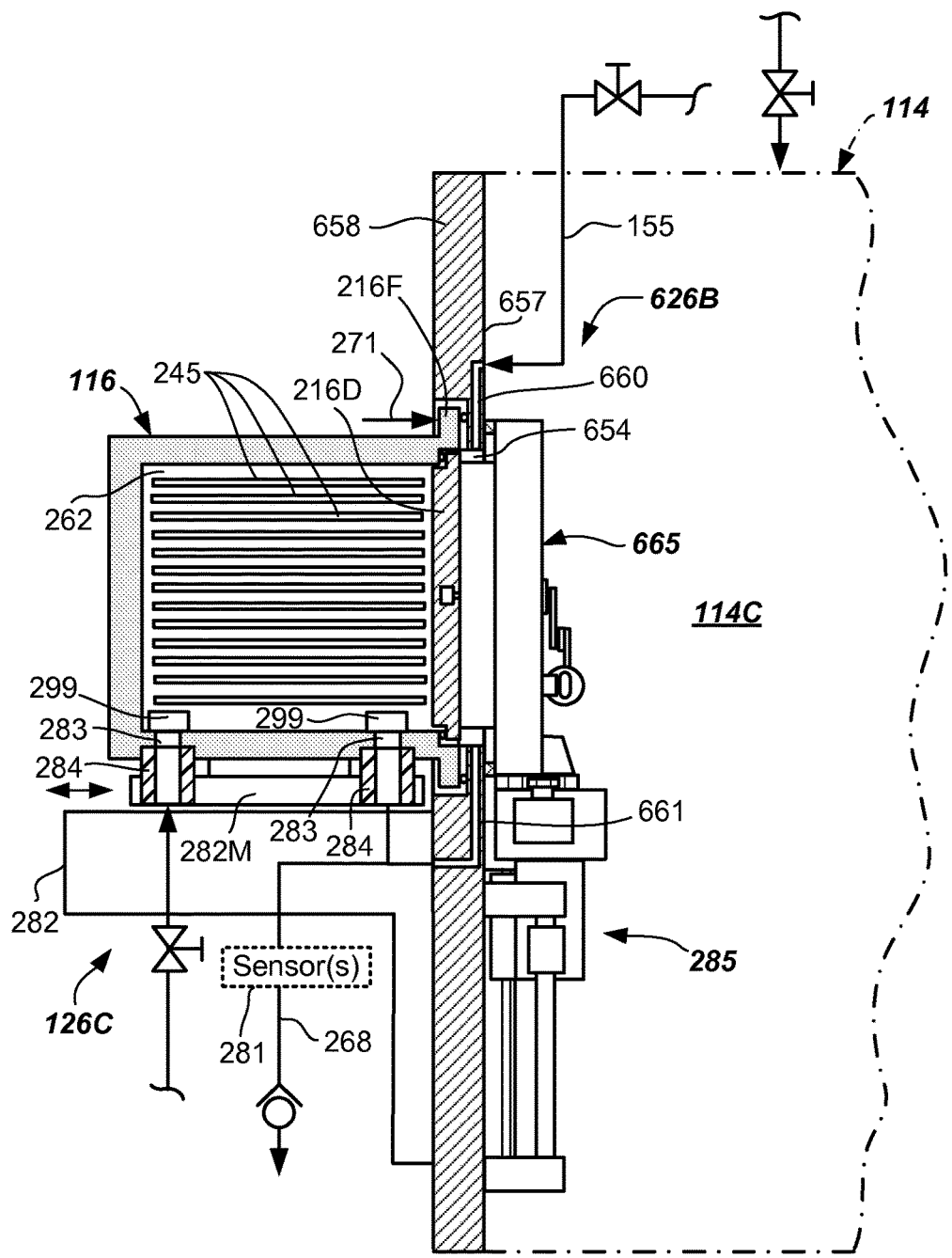
FIG. 6 illustrates a cross-sectioned side view of another embodiment of an electronic device processing system including an embodiment of carrier purge chamber environmental controls according to one or more embodiments.

FIG. 6 illustrates another embodiment of a carrier purge chamber environmental control system 626B. This embodiment enables purging of a volume between the carrier door 216D and the door opener 665 without an additional complexity and expense of a secondary housing (like carrier purge housing 256 of the FIG. 2 embodiment) surrounding the door opener 665. Carrier purge chamber environmental control system 626B includes one or more supply conduits 155 and valves coupled thereto, which couple to the inert gas supply (e.g., inert gas supply 118A). The one or more supply conduits 155 and valves supply inert gas to one or more carrier purge chambers 654 at certain times responsive to control signals from the controller (e.g., controller 125). For example, the supply of inert gas may be provided to each of the carrier purge chambers 654 prior to opening respective ones of the carrier doors 216D of substrate carriers 116 in order to purge an existing environment within the carrier purge chambers 654. Carrier purge chamber 654 may be purged to meet certain environmental preconditions in some embodiments. For example, environmental preconditions may be levels of oxygen ($O_2$), relative humidity (RH), temperature, or levels of one or more chemical contaminants described above. Such environmental preconditions may be met before opening the carrier door 216D and allowing the transfer of substrates 245 from the substrate carrier 116 into the factory interface chamber 114C.

The details and the components and operation of the carrier purge chamber environmental control system 626B will now be described with reference to FIG. 6. Carrier purge chamber environmental control system 626B may include a carrier purge chamber 654 for each substrate carrier 116 that includes such chamber purge capability. Such chamber purge capability may be included for some or all of the substrate carriers 116. At least portions of the load port back plate 658 and door opener 665 and possibly part of the carrier door 216D may form a part of each carrier purge chamber 654. Door opener 665 may seal against an inside surface of an inside wall 657 of a load port back plate 658 of the factory interface 114 (e.g., a front wall) and form the carrier purge chamber 654. Likewise, flange 216F may seal against an outside surface of load port back plate 658. Any suitable type of seal may be used, such as a gasket or O-ring. Door opener 665 remains sealed against the surface of inside wall 657 as the carrier purge chamber 654 receives a purging flow of inert gas from supply conduit 155 through one or more inflow passages 660, which may be partially or fully formed in the load port back plate 658. Inert gas may be provided at a suitable flow rate (e.g., 1 slm) to purge the carrier purge chamber 654. The inert gas may flow out through an outflow passage 661, which also may be partially or fully formed in the load port back plate 658.

During the purge of the carrier purge chamber 654, the carrier door 216D may be cracked open slightly thereby allowing escape of the carrier environment 262 to the carrier purge chamber 654. After a suitable purge to control environmental conditions to a desired predefined level, the carrier door 216D may be fully opened and moved away by the action of the door opener 665.

The purge of the carrier purge chamber 654 may take place so that the carrier environment 262, which may contain undesirable levels of $O_2$, moisture, particles, or other volatile gases and materials (e.g., chemical contaminants), does not enter the factory interface chamber 114C. Purging of the carrier purge chamber 654 may continue to ensure that certain environmental conditions are met.

As was discussed above, a carrier environmental control system 126C may be included in combination with the carrier purge chamber environmental control system 626B, and may be operative to control the carrier environment 262 within the substrate carrier 116 to meet certain environmental conditions. Accordingly, upon opening the carrier door 216D the carrier environment 262 within the substrate carrier 116 may already meet certain environmental preconditions. Thus, the time to open the door and unload the substrates 245 may be shortened.

Furthermore, upon loading of the substrates 245 in the substrate carrier 116 after processing and prior to transport, the carrier door 216D may be closed and the carrier environment 262 may be post-process purged. Valve assemblies 299 may be provided that may be operative to close the openings 283 and provide a sealed environment when the substrate carrier 116 is detached from the inlet and outlet seals 284 of the moving portion 282M of the docking platform 282.

Carrier purge chamber environmental control system 626B may be operational to control a relative humidity RH, an amount of oxygen ($O_2$), temperature, an amount of an inert gas, or amounts of one or more chemical contaminants (e.g., amines, bases, an amount of one or more VOCs), or the like within the carrier purge chambers 654. In some embodiments, one or more sensors 281, such as an oxygen sensor, RH sensor, chemical contaminant sensor, or the like, may be provided on a carrier exhaust conduit 268. One or more sensors 281 may be configured and adapted to sense an oxygen level, RH level, temperature, chemical contaminant levels as described above, or combinations thereof exiting the carrier purge chambers 654.

Carrier purge chamber environmental control system 626B may be combined with carrier environmental control system 126C, or may be used alone. For example, the carrier purge chamber 654 and the carrier environment 262 may both be purged by the carrier purge chamber environmental control system 626B by slightly cracking open the carrier door 216D and initiating a purge in through inflow passage 660 and out through outflow passage 661.

The elevator 285, as described above, lowers and raises the door opener 665 and carrier door 216D attached to door opener 665 so that a load/unload robot 117 (FIG. 1) may access the substrates 245 in the substrate carriers 116. Other suitable elevator systems may be used to raise and lower the door opener 665 and coupled carrier door 216D.

The foregoing description discloses only example embodiments of the invention. Modifications of the above-disclosed apparatus, systems and methods which fall within the scope of the invention will be readily apparent to those of ordinary skill in the art. Accordingly, while the present invention has been disclosed in connection with example embodiments, it should be understood that other embodiments may fall within the scope of the invention, as defined by the following claims.

The invention claimed is:

1. An electronic device processing system, comprising:
   a factory interface including a factory interface chamber;
   one or more substrate carriers coupled to the factory interface;
   an environmental control system coupled to the factory interface and to the one or more substrate carriers and operable to control an environment within the one or more substrate carriers and the factory interface chamber;
   a carrier purge chamber environmental control system configured and adapted to purge a carrier purge chamber until certain environmental conditions are met; and
   the carrier purge chamber being formed by at least portions of a load port back plate and a door opener sealed against an inside wall of the load port back plate.

2. The electronic device processing system of claim 1, wherein the environmental control system comprises:
   a carrier environmental control system that is operable to provide an inert gas to purge the one or more substrate carriers; and a factory interface environmental control system that is operable to provide an inert gas to the factory interface chamber.

3. The electronic device processing system of claim 1, wherein the environmental control system comprises:
a carrier environmental control system that is operable to provide an inert gas to the one or more substrate carriers; and
a carrier purge chamber environmental control system that is operable to provide an inert gas to a carrier purge chamber sealed to a wall of the factory interface.

4. The electronic device processing system of claim 1, wherein the control of the environment within the one or more substrate carriers and a factory interface chamber includes providing an inert gas to the one or more substrate carriers and the factory interface chamber that comprises argon, $N_2$ gas, or helium.

5. The electronic device processing system of claim 1, wherein the environmental control system is operational to control an amount of $O_2$, or an amount of an inert gas, within the factory interface chamber and the one or more substrate carriers.

6. The electronic device processing system of claim 1, comprising a humidity sensor adapted to sense relative humidity of the factory interface chamber or the one or more substrate carriers.

7. The electronic device processing system of claim 1 comprising an oxygen sensor adapted to sense an oxygen level of the factory interface chamber or the one or more substrate carriers.

8. The electronic device processing system of claim 1, comprising a controller configured and adapted to control one or more of:
a relative humidity,
an amount of $O_2$,
temperature,
an amount of inert gas, or
an amount of chemical contaminate
within the factory interface chamber or the one or more substrate carriers.

9. The electronic device processing system of claim 1, wherein the environmental control system comprises:
a controller; and
an inert gas supply responsive to the controller and configured and adapted to flow an amount of inert gas into the one or more substrate carriers and the factory interface chamber of the factory interface.

10. The electronic device processing system of claim 1, wherein the environmental control system comprises a carrier environmental control system coupled to a bottom of the one or more substrate carriers.

11. The electronic device processing system of claim 1, comprising a flange clamping system configured to seal a flange of the one or more substrate carriers to an outside wall of the factory interface.

12. The electronic device processing system of claim 1 further comprising at least one inflow passage connecting an inert gas supply to the carrier purge chamber, the inflow passage being at least partially formed in the load port back plate.

13. The electronic device processing system of claim 12 further comprising at least one outflow passage connected to the carrier purge chamber, the outflow passage being at least partially formed in the load port back plate.

14. The electronic device processing system of claim 13 further comprising one or more sensors connected in series with the outflow passage.

15. An electronic device processing system, comprising:
a factory interface including a factory interface chamber;
one or more substrate carriers coupled to the factory interface;
a carrier purge chamber between the factory interface chamber and the one or more substrate carriers, the carrier purge chamber defined by a purge housing sealed against an inside wall of the factory interface facing the factory interface chamber, the purge housing including a door opener configured to open and close a door on the one or more substrate carriers; and
an environmental control system coupled to the carrier purge chamber and the one or more substrate carriers and operable to control an environment within the one or more substrate carriers and the carrier purge chamber.

16. A method of processing substrates within an electronic device processing system, comprising:
providing a factory interface including a factory interface chamber;
providing one or more substrate carriers docked to the factory interface;
providing a carrier purge chamber between the factory interface chamber and the one or more substrate carriers, the carrier purge chamber defined by a purge housing sealed against an inside wall of the factory interface facing the factory interface chamber, the purge housing including a door opener configured to open and close a door on the one or more substrate carriers; and
controlling environmental conditions within the carrier purge chamber and the one or more substrate carriers.

17. The method of claim 16, comprising meeting environmental preconditions within the one or more substrate carriers before opening a substrate carrier door of the one or more substrate carriers.

18. The method of claim 16, wherein environmental conditions within the factory interface chamber and the one or more substrate carriers comprise one or more of:
a relative humidity below a predefined relative humidity threshold;
a temperature below a predefined temperature threshold;
an amount of $O_2$ below a predefined $O_2$ threshold;
an amount of an inert gas below a predefined flow threshold; and
an amount of chemical contaminate below a predefined chemical contaminant threshold.

19. The method of claim 16, wherein controlling the environmental conditions in the one or more substrate carriers is met by flowing an inert gas into a bottom entry of the one or more substrate carriers and flowing carrier environment out through a bottom exit.

20. The method of claim 16, comprising:
providing a chamber environmental control system including one or more carrier purge chambers associated with the one or more substrate carriers; and
controlling inert gas provided to the one or more carrier purge chambers to purge an environment of the one or more carrier purge chambers before fully opening a carrier door of the one or more substrate carriers.

21. The method of claim 20, comprising retracting a carrier purge housing from the inside wall of the factory interface only when one or both of a relative humidity threshold or an oxygen threshold are met.

22. A method of processing substrates within an electronic device processing system, comprising:

providing a factory interface including a factory interface chamber, one or more substrate carriers docked to the factory interface, and one or more carrier purge chambers defined by a purge housing sealed against an inside wall of the factory interface facing the factory interface chamber, the purge housing including a door opener configured to open and close a door on the one or more substrate carriers; and controlling environmental conditions within the factory interface chamber, the one or more carrier purge chambers, and the one or more substrate carriers.

23. An electronic device processing system, comprising:

a factory interface including a factory interface chamber;

one or more substrate carriers coupled to the factory interface;

a carrier purge chamber between the factory interface chamber and the one or more substrate carriers, wherein the carrier purge chamber is formed by at least portions of a load port back plate and a door opener sealed against an inside wall of the load port back plate; and a carrier purge chamber environmental control system configured and adapted to purge the carrier purge chamber until certain environmental conditions are met.

* * * * *